United States Patent
Adhiprakasha

(10) Patent No.: US 8,795,542 B2
(45) Date of Patent: Aug. 5, 2014

(54) REMOVAL OF SILICON NITRIDES DURING MANUFACTURING OF SEMICONDUCTOR DEVICES

(75) Inventor: Edwin Adhiprakasha, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 98 days.

(21) Appl. No.: 13/190,653

(22) Filed: Jul. 26, 2011

(65) Prior Publication Data

US 2013/0029495 A1 Jan. 31, 2013

(51) Int. Cl.
*C03C 15/00* (2006.01)

(52) U.S. Cl.
USPC .......................................... 216/99

(58) Field of Classification Search
USPC ............ 216/99; 252/79.1–79.4; 438/424, 700
See application file for complete search history.

(56) References Cited

U.S. PATENT DOCUMENTS

| | | | |
|---|---|---|---|
| 6,087,273 A * | 7/2000 | Torek et al. | 438/756 |
| 6,316,370 B1 | 11/2001 | Mercaldi et al. | |
| 6,972,241 B2 * | 12/2005 | Chiu et al. | 438/424 |
| 8,105,851 B1 | 1/2012 | Ku et al. | |
| 8,222,149 B2 * | 7/2012 | Chang | 438/700 |
| 2001/0037995 A1 * | 11/2001 | Akatsu et al. | 216/100 |
| 2010/0248440 A1 * | 9/2010 | Kirkpatrick et al. | 438/303 |
| 2013/0029495 A1 | 1/2013 | Adhiprakasha | |

OTHER PUBLICATIONS

SiliconFarEast; Wet Etching Recipes; 2005; www.SiliconFarEast; http://www.siliconfareast.com/etch_recipes. htm; 2 pages.
Lab Manual, Miscellaneous Etchants; University of California, Berkeley; Marvell Nanofabrication Laboratory; Berkeley Microfabrication Laboratory; 13 pages.
Clark; Silicon Nitride Etch; Bold Technologies, Inc.; 7 pages.

* cited by examiner

*Primary Examiner* — Lan Vinh
*Assistant Examiner* — Maki Angadi

(57) ABSTRACT

A method to remove excess material during the manufacturing of semiconductor devices includes providing a semiconductor wafer comprising silicon nitride deposited thereon and applying a chemical solution to the semiconductor wafer, wherein the chemical solution comprises a combination of sulfuric acid and deionized water.

17 Claims, 4 Drawing Sheets

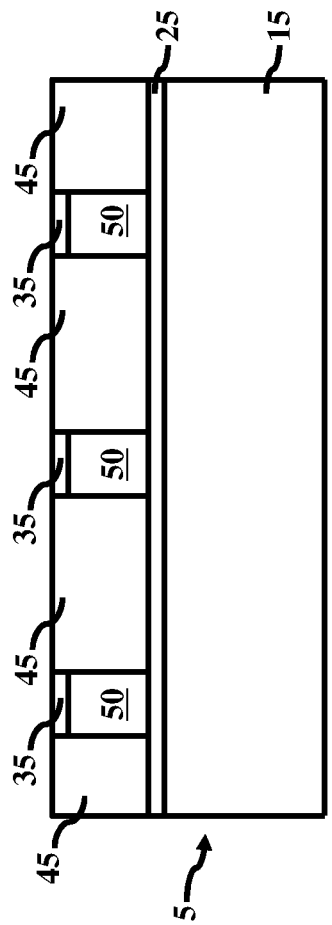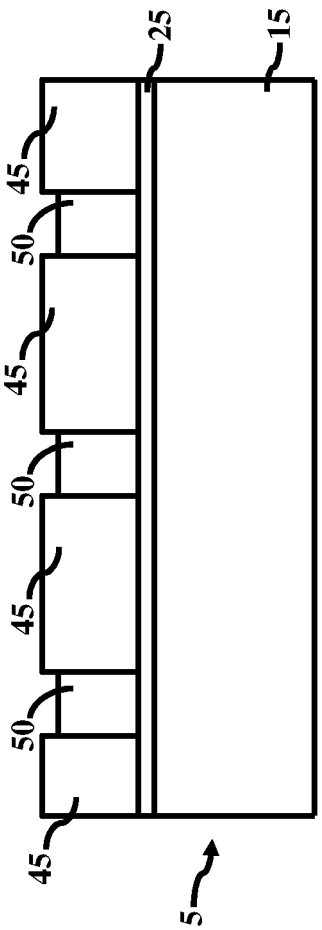

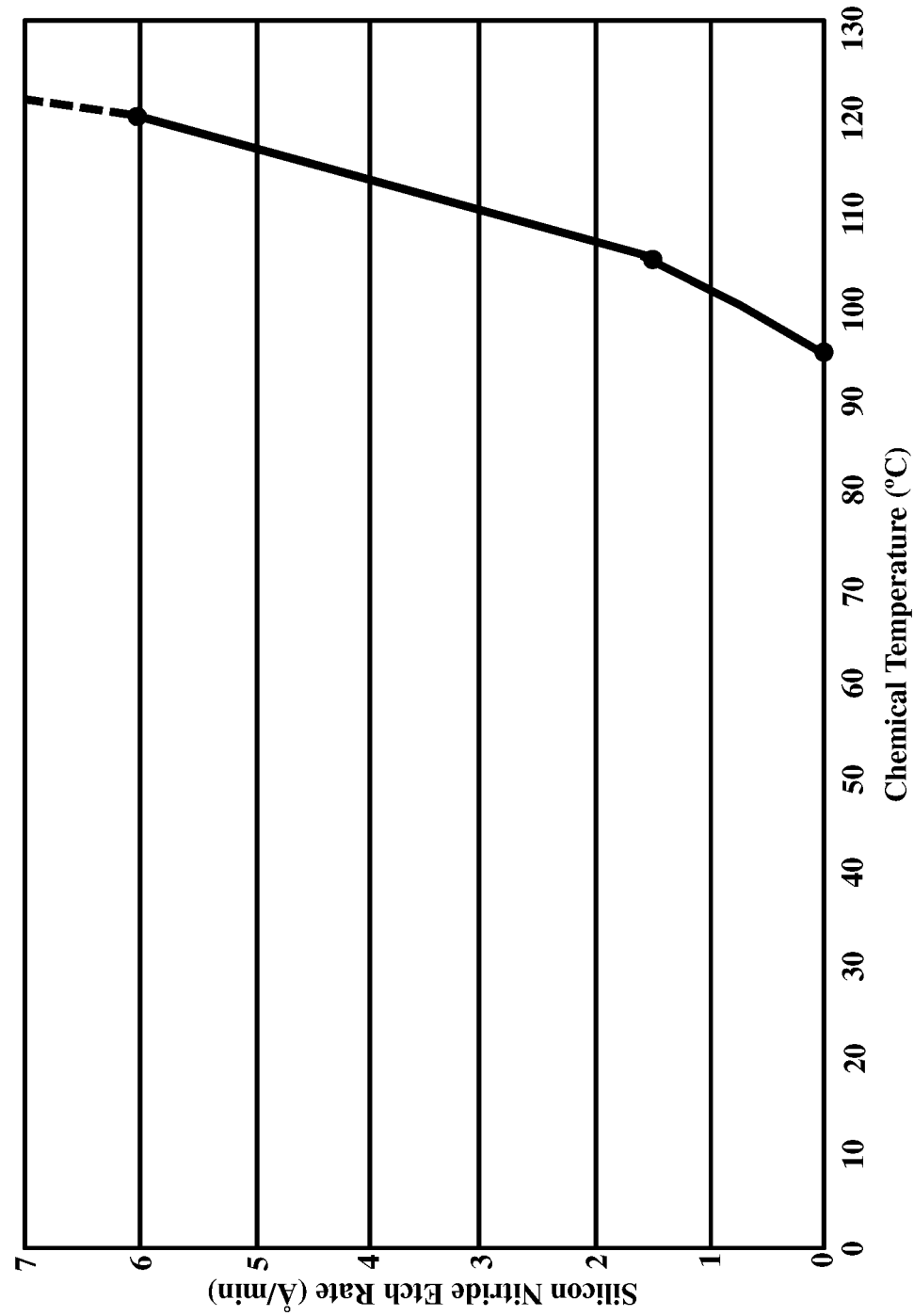

REMOVAL OF SILICON NITRIDES DURING MANUFACTURING OF SEMICONDUCTOR DEVICES

BACKGROUND

1. Technical Field

The embodiments herein generally relate to semiconductor processing techniques, and, more particularly, to the removal of silicon nitrides during semiconductor processing.

2. Description of the Related Art

In conventional semiconductor processing systems, many dangerous chemicals are used simply because an alternative has not been found. Moreover, since these chemicals often are used for a single purpose, handling these chemicals is not only dangerous, but costly as well. For example, silicon nitrides are conventionally etched with an aqueous solution of phosphoric acid and/or nitric acid during front end of line (FEOL) processing. However, the use of phosphoric acid and/or nitric acid is generally limited to the removal of silicon nitrides. Therefore, commercial semiconductor fabrication (fab) facilities dedicate resources (e.g., equipment, workflows, personnel, etc.) within their total processing capacity in order to run these specific chemistries for the sole purpose of etching silicon nitrides during semiconductor processing.

In a conventional fab, two different chemicals are generally used for two different purposes. A sulfuric acid mixture is used for stripping photoresists, while a phosphoric acid mixture is used for etching silicon nitrides. Typically, the fab dedicates some baths in a wet-station exclusively for use with the sulfuric acid mixture and other baths exclusively for use with the phosphoric acid mixture. Accordingly, the fab also needs to maintain a supply of two different chemicals (e.g., the sulfuric acid mixture and the phosphoric acid mixture), which adds to the overall processing costs.

Therefore, if resources could be consolidated (e.g., reducing one of the chemical mixtures used during semiconductor processing), then the overall processing costs could be reduced. Accordingly, what is needed is a method that allows for the removal of common materials (e.g., silicon nitrides) used during semiconductor processing and manufacturing. By so doing, fabs can reduce the overall cost of manufacturing by reducing the conventional dependence on special purpose chemicals (e.g., phosphoric acid and/or nitric acid), reducing specific resource allocation and dedication to those special purpose chemicals, consolidating resources, and streamlining workflow operations.

SUMMARY

In view of the foregoing, some embodiments herein provide methods comprising providing a wafer comprising silicon nitride; and applying a chemical solution to the silicon nitride at a controllable rate, wherein the chemical solution comprises a combination of a sulfuric acid component and deionized water in a concentration sufficient for removal of the silicon nitride from the wafer. The sulfuric acid component may be about 98% by weight. The sulfuric acid concentration in the chemical solution may be between 15% and 45%, by volume. The chemical solution may also comprise a hydrogen peroxide component. The hydrogen peroxide component may be at least 30% concentrated by weight. The hydrogen peroxide concentration in the chemical solution may be ≤85%, by volume. The ratio of the sulfuric acid component to the hydrogen peroxide component may be at least in a 3 to 1 ratio by volume in the chemical solution. Moreover, the controllable rate may comprise removal of the silicon nitride at 1.5 to 25 Angstroms per minute. The method may further comprise rinsing the chemical solution from the wafer, wherein rinsing of the chemical solution from the wafer may remove the silicon nitride from the wafer.

The approach provided by the embodiments herein is distinctively advantageous over the conventional approach for removing silicon nitrides from a wafer because the embodiments herein allow for cost cutting and resource consolidation by reducing the number of baths required in the overall processing workflow (e.g., eliminating the need for the phosphoric acid and/or nitric acid mixture bath). More specifically, if one can use the sulfuric acid mixture for both stripping photoresists and etching silicon nitrides, then silicon nitride etching can take place in the sulfuric acid baths that are already available and being used for photoresist stripping. This way, the fab can consolidate resources. Hence, the fab may need fewer numbers of baths, do away with phosphoric acid and/or nitric acid mixtures all together, and thus save on chemical costs.

Furthermore, because a sulfuric acid mixture is also generally considered harmless to other films, while a phosphoric acid mixture can attack silicon oxides, eliminating the need for a phosphoric acid mixture is advantageous. Moreover, sulfuric acid tends to be relatively free of metallic contaminants while phosphoric acid is generally more prone to containing a higher content of metal traces. Thus, the embodiments herein provide another advantage over the conventional approach by eliminating the need for the phosphoric acid mixture thereby providing for less contaminants in the wafers.

Other embodiments provide methods comprising providing a semiconductor wafer comprising silicon nitride, wherein the silicon nitride comprises silicon atoms and nitrogen atoms; applying a chemical solution to the semiconductor wafer, wherein the chemical solution comprises a sulfuric acid component, hydrogen cations, sulfate anions, and deionized water, wherein the hydrogen cations interact with the nitrogen atoms, and wherein the sulfate anions interact with the silicon atoms to form water soluble complexes; and rinsing the chemical solution from the semiconductor wafer. The sulfuric acid component may be about 98% by weight. The sulfuric acid concentration in the chemical solution may be between 15% and 45% concentrated, by volume. The chemical solution may also comprise a hydrogen peroxide component. The hydrogen peroxide component may be at least 30% concentrated by weight. The hydrogen peroxide concentration in the chemical solution may be ≤85% by volume. The ratio of the sulfuric acid component to the hydrogen peroxide component may be at least in a 3 to 1 ratio by volume in the chemical solution. The method may further comprise removing the silicon nitride from the semiconductor wafer.

Other embodiments provide methods comprising providing a substrate comprising silicon nitride, wherein the silicon nitride comprises silicon atoms and nitrogen atoms; applying a chemical solution to the substrate, wherein the chemical solution comprises a sulfuric acid component and deionized water in a concentration sufficient for removal of the silicon nitride from the substrate; and rinsing the chemical solution from the substrate using deionized water. The sulfuric acid concentration in the chemical solution may be between 23% to 60%, by weight. The chemical solution may also comprise a hydrogen peroxide component. The hydrogen peroxide component may be at least 30% concentrated by weight. The hydrogen peroxide concentration in the chemical solution may be ≤77% by weight. Moreover, applying the chemical solution to the substrate occurs when a temperature of the chemical solution is at least 105° C. The rinsing may occur for at least five minutes.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3 illustrates another schematic diagram of a silicon substrate with silicon nitride residuals on an integrated circuit material according to the embodiments herein;

FIG. 4 illustrates another schematic diagram after removal silicon nitride residuals on an integrated circuit material according to the embodiments herein;

FIG. 5 is a graphical illustration representing the silicon nitride etch rate versus the chemical temperature according to one embodiment herein.

DETAILED DESCRIPTION

Figure 1:
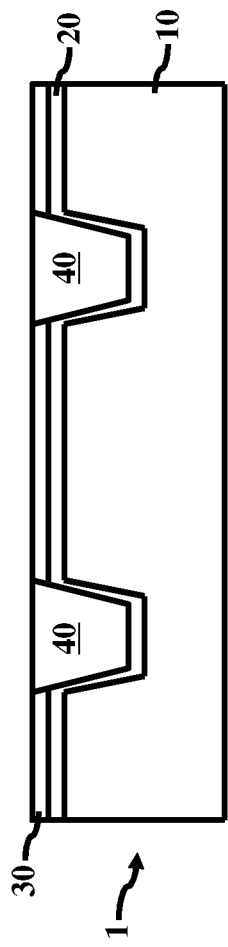
FIG. 1 illustrates a schematic diagram of a silicon substrate with silicon nitride residuals on an integrated circuit material according to the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a method to remove excess silicon nitrides (e.g., as a by-product of semiconductor processing) using cost effective chemicals (e.g., using sulfuric acid). Referring now to the drawings, and more particularly to FIGS. 1 through 6, where similar reference characters denote corresponding features consistently throughout the figures, there are shown various embodiments.

Figure 2:
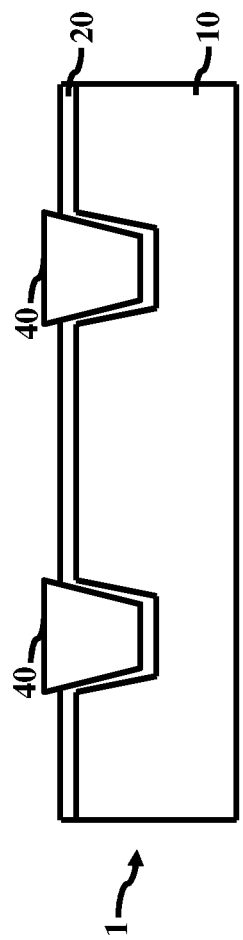
FIG. 2 illustrates a schematic diagram after removal silicon nitride residuals on an integrated circuit material according to the embodiments herein.

FIG. 1 illustrates a schematic diagram of device 1, according to some embodiments herein. As shown in FIG. 1, device 1 includes a semiconductor substrate (e.g., silicon substrate) 10 and a liner oxide layer 20 (e.g., silicon dioxide) deposited thereon. According to some embodiments herein, liner oxide layer 20 is formed to a thickness of approximately 200 Å or less. Also shown in FIG. 1 is a hardmask nitride layer 30 (e.g., a silicon nitride) deposited over the liner oxide layer 20 and covering shallow trench isolation regions 40. According to some embodiments herein, hardmask nitride layer 30 is formed to a thickness of approximately 1,000 Å or less. FIG. 2, with reference to FIG. 1, illustrates a schematic diagram of device 1 after hardmask nitride layer 30 has been etched away according to the embodiments herein. The chemicals used to etch the hardmask nitride layer 30 are described in further detail below.

FIG. 3 illustrates a schematic diagram of device 5 according to some embodiments herein. As shown in FIG. 3, device 5 includes a semiconductor substrate (e.g., silicon substrate) 15 and a gate oxide layer 25 (e.g., silicon dioxide) deposited thereon. According to some embodiments herein, gate oxide layer 25 is formed to a thickness of approximately 300 Å or less. Also shown in FIG. 3 is an oxide isolation layer 45 (e.g., silicon dioxide) and poly-silicon gates 50 with a hardmask nitride layer 35 (e.g., a silicon nitride) deposited over the oxide isolation layer 45. According to some embodiments herein, hardmask nitride layer 35 is formed to a thickness of 1,000 Å or less. FIG. 4, with reference to FIG. 3, illustrates a schematic diagram of device 5 after hardmask nitride layer 35 has been etched away according to the embodiments herein. The chemicals used to etch the hardmask nitride layer 35 are described in further detail below.

According to some embodiments herein, the etchant used to etch hardmask nitride layer 30 in device 1 (shown in FIGS. 1 and 2) and hardmask nitride layer 35 in device 5 (shown in FIGS. 3 and 4) includes a mixture of a $H_2SO_4$ component (e.g., sulfuric acid) and a $H_2O_2$ component (e.g., hydrogen peroxide) (where a sulfuric acid and hydrogen peroxide solution is also commonly known as a piranha solution) along with water (e.g., preferably deionized (DI) water). According to some embodiments herein, the piranha solution is used to etch the photoresist and then diluted in deionized water to perform the silicon nitride etch to achieve significant cost savings during the semiconductor processing because the fab no longer has to dedicate chambers for phosphoric/nitric acids and no longer has to store/consume these chemicals.

In addition, according to other embodiments herein, the silicon nitride etchant used to etch hardmask nitride layer 30 in device 1 (shown in FIGS. 1 and 2) and hardmask nitride layer 35 in device 5 (shown in FIGS. 3 and 4) is a mixture of a sulfuric acid component and DI water. According to some embodiments herein, commercial grade sulfuric acid (e.g., between 95-98% concentration by weight) is used to create a silicon nitride etch (i.e., the aqueous sulfuric acid solution) and the photoresist etch (e.g., a mixture of sulfuric acid and hydrogen peroxide) to achieve significant cost savings.

Since both a piranha solution and sulfuric acid are used for numerous purposes in a semiconductor fabrication facility (e.g., as an etchant of photoresist residues on a silicon substrate, to create custom piranha solution concentrations, etc.), semiconductor fabrication facilities are able to reduce overall processing costs by consolidating resources and operations and eliminating materials and time required when using materials other than the etchants described above according to the embodiments herein. However, the use of these chemicals for the purposes of etching silicon nitride have yet to be realized in the industry due to the longstanding processing norms used in industry.

The results described above may be attributed to, for example, the reaction between sulfuric acid and water that produces hydrogen cations and sulfate anions. Thereafter, the hydrogen cations interact with the nitrogen atom of the silicon nitrides (where silicon nitrides, in general, have the chemical formula $Si_xN_y$), while the sulfate anions interact with the silicon atom of the silicon nitrides to form water soluble complexes. The aforementioned reaction produces byproducts that are energetically favorable and may be subsequently washed away during a subsequent rinse. Hence, as a result of the reaction described above, silicon nitrides (e.g., hardmask nitride layer 30, 35) are "dissolved" or "etched" away by application of the above-described etchants. In addition, according to some embodiments herein, water provides ample hydrogen cations and assists in the creation of sulfate anions, which are used to initiate and propagate the reaction described above with silicon nitrides.

FIG. 5, with reference to FIGS. 1 through 4, is a graphical illustration representing the silicon nitride etch rate versus the temperature of the chemical solution, according to some embodiments herein. As shown in FIG. 5, minimal (e.g., approximately 0 Å/minute) silicon nitride (e.g., $Si_3N_4$) etching occurs when the temperature of the sulfuric acid/DI water or piranha solution/DI water mixtures are at approximately 95° C. At an approximately 105° C. temperature level, FIG. 5 shows the sulfuric acid/DI water or piranha solution/DI water mixtures etching the silicon nitrides (e.g., $Si_3N_4$) at approximately 1.5 Å/minute. In addition, at approximately 120° C., the sulfuric acid/DI water or piranha solution/DI water mixtures etch rate for silicon nitrides is approximately 6 Å/minute. According to some embodiments herein, the chemical solution is applied to the silicon nitride near the boiling point of the chemical solution, which is approximately 140° C., where the silicon nitride etch rate is maximal (e.g., approximately 25 Å/min). Generally, the silicon nitride etch rate increases approximately four times for every 15° C. increase in temperature above 105° C.

According to some embodiments herein, sulfuric acid includes approximately 95%-98% of $H_2SO_4$, by weight, in DI water, which is a commonly available liquid form of concentrated $H_2SO_4$. Furthermore, according to some embodiments herein, hydrogen peroxide includes 30% of $H_2O_2$, by weight, in DI water, which is a commonly available liquid form of $H_2O_2$. In FIG. 5, the concentrations in the chemical solution, by volume, of sulfuric acid are between approximately 15% and 45%. In addition, according to some embodiments herein, the concentration of $H_2SO_4$ in the chemical solution is between approximately 23% and 60%, by weight.

Figure 6:
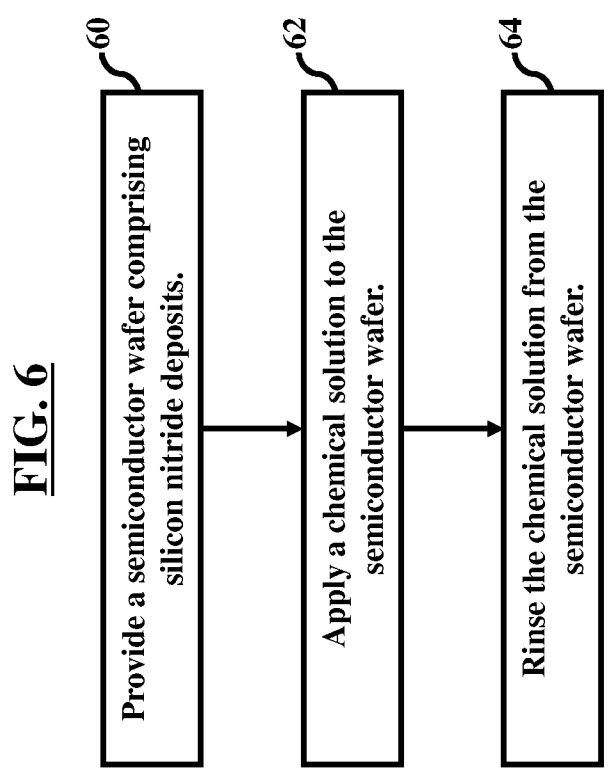
FIG. 6 illustrates a flow diagram of a silicon nitride removal method according to an embodiment herein.

Furthermore, according to some embodiments herein, the silicon nitride etchant described above is a chemical solution employed in the method shown in FIG. 6, with reference to FIGS. 1 through 5. As shown in step 60, a semiconductor wafer (e.g., silicon substrate 10, 15) is provided. In step 62, the $H_2SO_4$ present in the solution selectively etches the silicon nitrides (e.g., hardmask nitride layer 30, 35) at a controllable rate (e.g., between 1.5 and 6 Angstroms/minute according to some embodiments herein). Examples of $H_2SO_4$ containing components include, but are not limited to: concentrated sulfuric acid, diluted sulfuric acid, and piranha solution. According to some embodiments herein, the concentration of such $H_2SO_4$ containing compounds in the chemical solution is between approximately 23% to 60%, by weight. Next, in the method shown in FIG. 6, the $H_2SO_4$ solution is removed (in step 64) during a water rinse.

According to some embodiments of the rinse, for example, the foregoing chemicals are removed from the wafer (e.g., silicon substrate 10) in approximately 10 seconds, although the overall rinse may be longer as described below. Water is then applied onto the wafer (e.g., silicon substrate 10) at a constant rate (e.g., approximately 1 liter/min) in order to remove the chemical solution from the wafer (e.g., silicon substrate 10). A vacuum line (not shown) simultaneously removes the water at a lower rate (e.g., approximately 0.5 liter/min) so that the surface of the substrate 10, 15 is constantly flushed with fresh water, or alternatively, the water is removed at the same rate as the water is supplied. According to some embodiments herein, the overall water rinse time is between 5 to 10 minutes. With relatively warm water (e.g., approximately 60-70° C.), the rinse time can be in the shorter end of the range (i.e., closer to 5 minutes); while with relatively cool water (e.g., less than approximately 60° C.), the rinse time is in the longer end of the range (i.e., closer to 10 minutes). However, chemical solutions containing sulfuric acid are typically viscous, thus warm water and sufficiently longer rinse times are preferred to ensure complete rinsing. After rinsing, the water is completely shut off and the vacuum line completely removes the water.

As described above, one of the aspects of the embodiments herein is that common chemicals (e.g., a piranha solution) used in semiconductor processing or common commercial concentrations of readily available materials (e.g., commercial-grade sulfuric acid) can replace the special purpose solvents currently used in conventional semiconductor processing to selectively etch silicon nitride films. By utilizing the embodiments herein, semiconductor fabrication facilities can reduce the overall cost of manufacturing semiconductor devices 1, 5 by reducing the conventional dependence on special purpose chemicals (e.g., phosphoric acid, nitric acid), reducing specific resource allocation and dedication to those special purpose chemicals, consolidating resources, and streamlining workflow operations.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of illustrated embodiments, those skilled in the art will recognize that the embodiments herein can be practiced with modification within the spirit and scope of the appended claims.

What is claimed is:

1. A method for processing a substrate, the method comprising:
   providing a substrate comprising photoresist and silicon nitride;
   applying a chemical solution to the substrate, wherein the chemical solution comprises a sulfuric acid component and a hydrogen peroxide component, and the chemical solution etches the photoresist;
   adding deionized water to the chemical solution to dilute the chemical solution; and
   exposing the substrate to the diluted chemical solution, wherein during the exposing of the substrate to the diluted chemical solution, the diluted chemical solution etches all of the silicon nitride from the substrate.

2. The method of claim 1, wherein a concentration of sulfuric acid in the diluted chemical solution is between 15% and 45% by volume.

3. The method of claim 2, wherein a concentration of hydrogen peroxide in the diluted chemical solution is <85% by volume.

4. The method of claim 2, wherein a ratio of the sulfuric acid component to the hydrogen peroxide component in the diluted chemical solution is at least 3 to 1 by volume.

5. The method of claim 1, wherein the etching of the silicon nitride comprises etching the silicon nitride at 1.5 to 25 Angstroms per minute such that a thickness of the silicon nitride is reduced during the etching.

6. The method of claim 1, wherein the adding of the deionized water to the chemical solution occurs after the applying of the chemical solution to the substrate.

7. The method of claim 1, wherein a temperature of the diluted chemical solution is at least 105° C. during the exposing of the substrate to the diluted chemical solution, and further comprising rinsing the diluted chemical solution from the substrate, wherein the rinsing of the diluted chemical solution from the substrate removes the silicon nitride from the substrate.

8. A method comprising:
   providing a semiconductor wafer comprising photoresist and silicon nitride;
   applying a chemical solution to the semiconductor wafer, wherein the chemical solution comprises a sulfuric acid component and a hydrogen peroxide component, and the chemical solution etches the photoresist;
   adding deionized water to the chemical solution to dilute the chemical solution;
   exposing the semiconductor wafer to the diluted chemical solution, wherein during the exposing of the substrate to the diluted chemical solution, the diluted chemical solution etches all of the silicon nitride from the semiconductor wafer; and
   rinsing the diluted chemical solution from the semiconductor wafer.

9. The method of claim 8, wherein the adding of the deionized water to the chemical solution occurs after the applying of the chemical solution to the semiconductor wafer, and a concentration of sulfuric acid in the diluted chemical solution is between 15% and 45% by volume.

10. The method of claim 9, wherein a concentration of hydrogen peroxide in the dilute chemical solution is <85% by volume.

11. The method of claim 9, wherein a ratio of the sulfuric acid component to the hydrogen peroxide component in the diluted chemical solution is at least 3 to 1 by volume.

12. The method of claim 8, wherein a temperature of the diluted chemical solution is at least 105° C. during the exposing of the semiconductor substrate to the diluted chemical solution and the etching of the silicon nitride comprises etching the silicon nitride at 1.5 to 25 Angstroms per minute such that a thickness of the silicon nitride is reduced during the etching.

13. A method comprising:
   providing at least one substrate comprising photoresist and silicon nitride;
   applying a chemical solution to the at least one substrate, wherein the chemical solution comprises a sulfuric acid component and a hydrogen peroxide component, and the chemical solution etches the photoresist;
   after the applying of the chemical solution to the at least one substrate, adding deionized water to the chemical solution to dilute the chemical solution; and
   exposing the at least one substrate to the diluted chemical solution, wherein during the exposing of the substrate to the diluted chemical solution, the diluted chemical solution etches all of the silicon nitride from the at least one substrate.

14. The method of claim 13, wherein a concentration of sulfuric acid in the diluted chemical solution is between 15% and 45% by volume.

15. The method of claim 14, wherein a concentration of hydrogen peroxide in the dilute chemical solution is <77% by volume.

16. The method of claim 14, wherein the exposing of the at least one substrate to the diluted chemical solution occurs when a temperature of the diluted chemical solution is at least 105° C.

17. The method of claim 13, further comprising rinsing the at least one substrate after the exposing of the at least one substrate to the diluted chemical solution, wherein the rinsing occurs for at least five minutes.

* * * * *